(12) United States Patent
Lam et al.

(10) Patent No.: US 11,488,820 B2
(45) Date of Patent: Nov. 1, 2022

(54) METHOD OF FABRICATING LAYERED STRUCTURE

(71) Applicant: JIANGSU ADVANCED MEMORY TECHNOLOGY CO., LTD., Huaian (CN)

(72) Inventors: Chung Hon Lam, Zhubei (TW); Hao Ren Zhuang, Zhubei (TW); Kuo-Feng Lo, Zhubei (TW); Yen Yu Hsu, Zhubei (TW)

(73) Assignee: JIANGSU ADVANCED MEMORY TECHNOLOGY CO., LTD., Huaian (CN)

( * ) Notice: Subject to any disclaimer, the term of this patent is extended or adjusted under 35 U.S.C. 154(b) by 106 days.

(21) Appl. No.: 17/035,197

(22) Filed: Sep. 28, 2020

(65) Prior Publication Data

US 2021/0028003 A1 Jan. 28, 2021

Related U.S. Application Data

(63) Continuation of application No. 16/537,348, filed on Aug. 9, 2019, now Pat. No. 10,903,069.

(30) Foreign Application Priority Data

Jun. 28, 2019 (CN) .......................... 201910574839.9

(51) Int. Cl.
*H01L 21/02* (2006.01)
*H01L 21/768* (2006.01)
*H01L 21/3213* (2006.01)
*H01L 21/321* (2006.01)

(52) U.S. Cl.
CPC ........ *H01L 21/022* (2013.01); *H01L 21/3212* (2013.01); *H01L 21/32138* (2013.01); *H01L 21/76816* (2013.01)

(58) Field of Classification Search
None
See application file for complete search history.

(56) References Cited

U.S. PATENT DOCUMENTS

| | | | |
|---|---|---|---|
| 6,616,514 B1* | 9/2003 | Edelbach | C09K 3/1463 451/36 |
| 6,997,785 B1* | 2/2006 | Rueb | H01L 21/31053 438/692 |
| 2009/0189136 A1* | 7/2009 | Matsuzaki | H01L 27/2436 257/E21.409 |
| 2020/0388755 A1* | 12/2020 | Chang | H01L 45/1266 |

* cited by examiner

*Primary Examiner* — Erik Kielin
(74) *Attorney, Agent, or Firm* — Maschoff Brennan

(57) ABSTRACT

A method of fabricating layered structure is disclosed. A basal layer is formed. A laminate is formed on the basal layer, and the laminate includes a device layer, a sacrificial layer and a protection layer stacked in sequence. The device layer, the sacrificial layer and the protection layer are etched to obtain a patterned laminate. A first dielectric layer covering a lateral surface of the patterned laminate is formed. Part of the first dielectric layer and part of the protection layer are removed by polishing. The protection layer of the patterned laminate is etched to expose the sacrificial layer. A through hole in the first dielectric layer is formed to expose the basal layer. The sacrificial layer of the patterned laminate is etched to form an opening in the first dielectric layer, and the opening exposes a top surface of the device layer.

7 Claims, 11 Drawing Sheets

METHOD OF FABRICATING LAYERED STRUCTURE

CROSS-REFERENCE TO RELATED APPLICATIONS

This non-provisional application is a continuation patent application of U.S. patent application Ser. No. 16/537,348 filed on Aug. 9, 2019, which claims priority under 35 U.S.C. § 119(a) on Patent Application No(s). 201910574839.9 filed in China on Jun. 28, 2019, the entire contents of which are hereby incorporated by reference.

BACKGROUND

1. Technical Field

This present disclosure relates to a method of fabricating layered structure, particularly to a method of fabricating layers in a semiconductor device.

2. Related Art

With the development of electronics industry, the demand of small and high speed electronic components has been increasing, particularly to the electronic components with complicated and sophisticated functions. A semiconductor device is developed to meet the requirements of low manufacturing cost, outstanding performance and compact size. However, the compactness of semiconductor device brings more complexity to the semiconductor process. Thus, there is a need for advances in semiconductor processes and technologies to achieve sustainable development. For example, a planar memory cell can be scaled down to smaller size by improving processes and circuit design. The integrated circuit (IC) is widely used as a technique for the miniaturization of semiconductor devices. In the IC, different layers are stacked to form a layered structure, and it is important to provide good electrical interconnection of each layer in the vertical direction.

Regarding the fabrication of IC, in order to expose the metal layer and/or the semiconductor element buried in the electrically insulating layer, one of the processes is to remove part of the electrically insulating layer by a chemical mechanical polishing (CMP) process.

SUMMARY

According to one aspect of the present disclosure, a method of fabricating layered structure includes: forming a basal layer; forming a laminate on the basal layer, the laminate comprising a device layer, a sacrificial layer and a protection layer stacked in sequence; etching the device layer, the sacrificial layer and the protection layer so as to obtain a patterned laminate; forming a first dielectric layer covering a lateral surface of the patterned laminate; removing part of the first dielectric layer and part of the protection layer by polishing; etching the protection layer of the patterned laminate so as to expose the sacrificial layer; forming a through hole in the first dielectric layer so as to expose the basal layer; and etching the sacrificial layer of the patterned laminate so as to form an opening in the first dielectric layer, and the opening exposing a top surface of the device layer.

According to another aspect of the present disclosure, a method of fabricating layered structure includes: forming a laminate comprising a device layer, a sacrificial layer and a protection layer stacked in sequence; forming a dielectric layer covering a lateral surface of the patterned laminate; removing part of the dielectric layer and part of the protection layer by chemical mechanical polishing; and removing residue of the protection layer and the sacrificial layer by different etching processes so as to expose the device layer.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
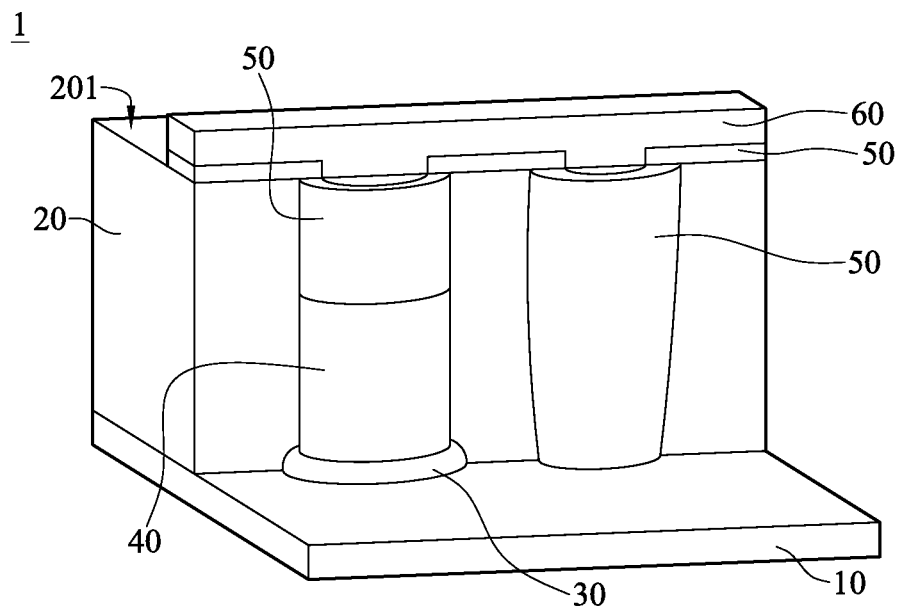
FIG. 1 is a perspective view of a layered structure according to one embodiment of the present disclosure.
Figure 2:
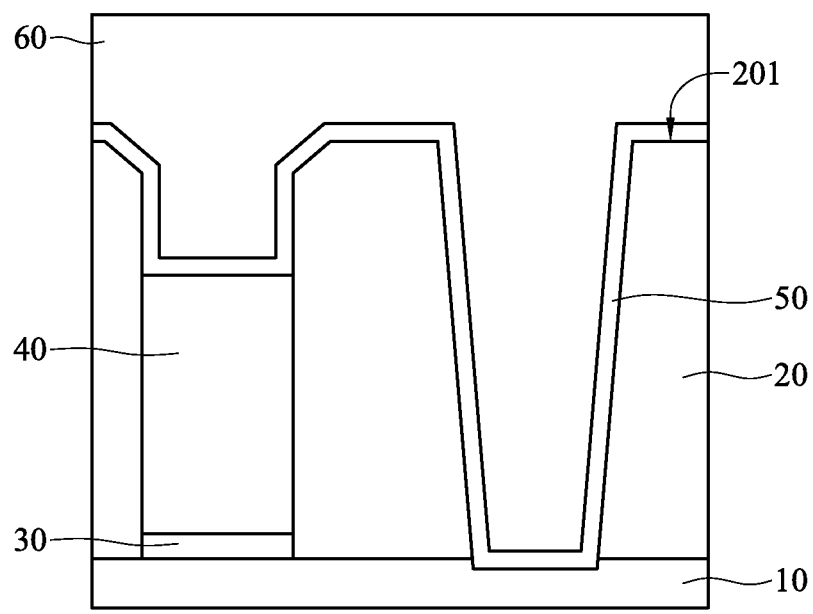
FIG. 2 is a cross-sectional view of the layered structure in FIG. 1.

Please refer to FIG. 1 and FIG. 2. FIG. 1 is a perspective view of a layered structure according to one embodiment of the present disclosure. FIG. 2 is a cross-sectional view of the layered structure in FIG. 1. In this embodiment, a layered structure 1 includes a basal layer 10, a dielectric layer 20, a first auxiliary layer 30, a device layer 40, a second auxiliary layer 50 and a conductive metal layer 60. The layered structure 1, for example, is a circuit structure built at BEOL (back end of line) of an IC, and said IC is, for example, a phase-change memory chip. For the purpose of convenient illustration, part of the dielectric layer 20 is omitted in FIG. 1.

The basal layer 10 can be a metal basal layer or a non-metal basal layer. As to the metal basal layer, the basal layer 10 is made of a material such as tungsten, copper, aluminum, cobalt and aluminum copper alloy. As to the non-metal basal layer, the basal layer 10 is made of a material such as silicon and glass. It is noting that the present disclosure is not limited to the material of the basal layer 10.

The dielectric layer 20 is disposed on the basal layer 10. The dielectric layer 20 is made of a material such as silicon oxide, silicon nitride and other low-κ materials. It is noting that the present disclosure is not limited to the material of the dielectric layer 20.

The first auxiliary layer 30 is disposed on the basal layer 10. The first auxiliary layer 30, for example, is a diffusion barrier layer or an adhesive layer. The first auxiliary layer 30 is made of a material such as tungsten nitride, titanium, titanium nitride, tantalum, tantalum nitride and tungsten silicon. It is noting that the present disclosure is not limited to the material of the first auxiliary layer 30.

The device layer 40 is disposed on the first auxiliary layer 30. The device layer 40 can be a metal layer or a semiconductor layer such as diode, transistor, conductive via and silicon-based semiconductor layer. The silicon-based semiconductor layer can be a silicon-germanium (SiGe) layer or a silicon carbide (SiC) layer. It is noting that the present disclosure is not limited to the material of the device layer 40.

The second auxiliary layer 50, for example, is a diffusion barrier layer or an adhesive layer which covers the dielectric layer 20 and the device layer 400. The second auxiliary layer 50 is made of a material such as tungsten nitride, titanium, titanium nitride, tantalum, tantalum nitride and tungsten silicon. It is noting that the present disclosure is not limited to the material of the second auxiliary layer 50.

The conductive metal layer 60 is disposed on the second auxiliary layer 50. The conductive metal layer 60 is made of a material such as tungsten, copper, aluminum, cobalt and aluminum copper alloy. It is noting that the present disclosure is not limited to the material of the conductive metal layer 60.

The first auxiliary layer 30 and the second auxiliary layer 50 are optionally disposed according to actual requirements. In some embodiments, the layered structure does not include the first auxiliary layer 30 and the second auxiliary layer 50, the device layer 40 is directly disposed on the basal layer 10, and the conductive metal layer 60 is directly disposed on the basal layer 10 and the dielectric layer 20.

A method of fabricating the layered structure 1 in FIG. 2 is described hereafter. Please refer to FIG. 3, which is a cross-sectional view of a laminate according to one embodiment of the present disclosure. First, the basal layer 10 is provided, and a laminate ML is formed on the surface of the basal layer 10. The laminate ML includes a first auxiliary layer 30, a device layer 40, a sacrificial layer 41, a protection layer 42 and a hard mask 43 stacked in sequence. Herein, the hard mask 43 is optionally deposited.

The sacrificial layer 41 is made of a material such as silicon oxide and silicon nitride, but the present disclosure is not limited thereto. The protection layer 42 is made of a material such as silicon oxide, silicon nitride and organic compound, but the present disclosure is not limited thereto. The hard mask 43 is made of a material such as silicon oxide, silicon nitride and silicon carbide, but the present disclosure is not limited thereto.

Take a specific embodiment for example, a copper layer is provided as the basal layer 10, and the laminate ML is deposited on the copper layer. As to the laminate ML, the first auxiliary layer 30 is a tungsten nitride layer with a thickness of 20.0 nanometers (nm), the device layer 40 is a silicon diode with a thickness of 500.0 nm, the sacrificial layer 41 is a silicon oxide layer with a thickness of 30.0 nm, the protection layer 42 is a silicon nitride layer with a thickness of 200.0 nm, and the hard mask 43 is a silicon carbide layer with a thickness of 100.0 nm. In this embodiment, the first auxiliary layer 30 is taken as a diffusion barrier layer for preventing the diffusion of copper atoms of the basal layer 10 into the device layer 40. In some embodiments, the first auxiliary layer 30 can be made of different material so as to be taken as an adhesive layer for increasing the adhesion strength between the device layer 40 and the basal layer 10.

It is noting that the present disclosure is not limited to the aforementioned thicknesses of each layer of the laminate ML. Preferably, the first auxiliary layer 30 has a thickness of 10.0 nm to 200.0 nm, and the device layer 40 has a thickness of 30.0 nm to 500.0 nm. The sacrificial layer 41 has a thickness of 3.0 nm to 30.0 nm, the protection layer 42 has a thickness of 30.0 nm to 300.0 nm, and the hard mask 43 has a thickness of 5.0 nm to 100.0 nm.

Then, the laminate ML is patterned so as to be shaped for meeting the requirements of IC design. Please further refer to FIG. 4 through FIG. 6, which are cross-sectional views of patterning the laminate in FIG. 3. A mask 70a is formed on the laminate ML, and the mask 70a includes an anti-reflective layer 710a and a patterned photoresist 720a. The anti-reflective layer 710a is disposed on the hard mask 43, and the patterned photoresist 720a is disposed on the anti-reflective layer 710a. The patterned photoresist 720a can be obtained by patterning a photoresist film used in optical lithography. Herein, the anti-reflective layer 710a is, for example, a chromium layer configured to minimize light reflection that would double-expose the photoresist, while the anti-reflective layer 710a is optionally deposited according to process requirements.

Figure 5:
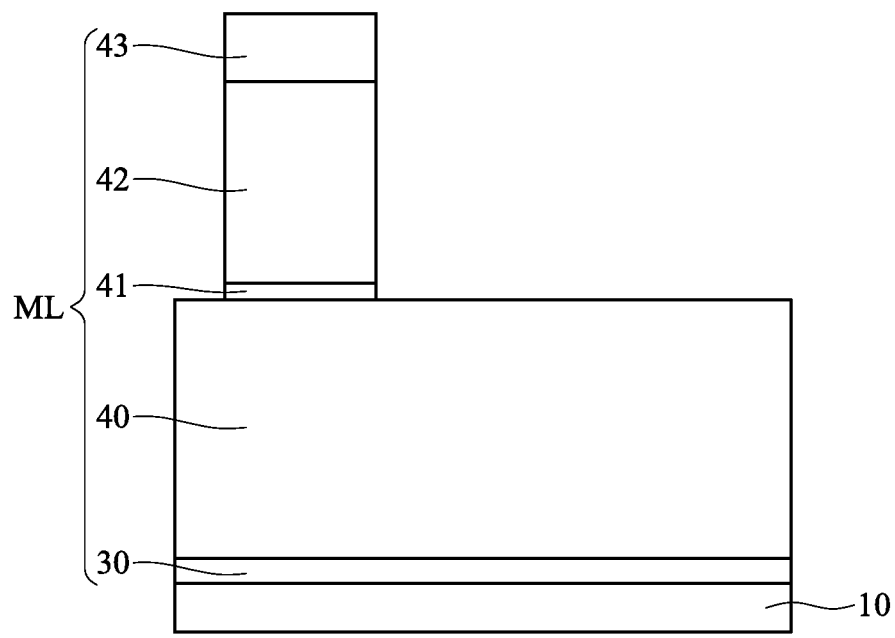
Figure 6:
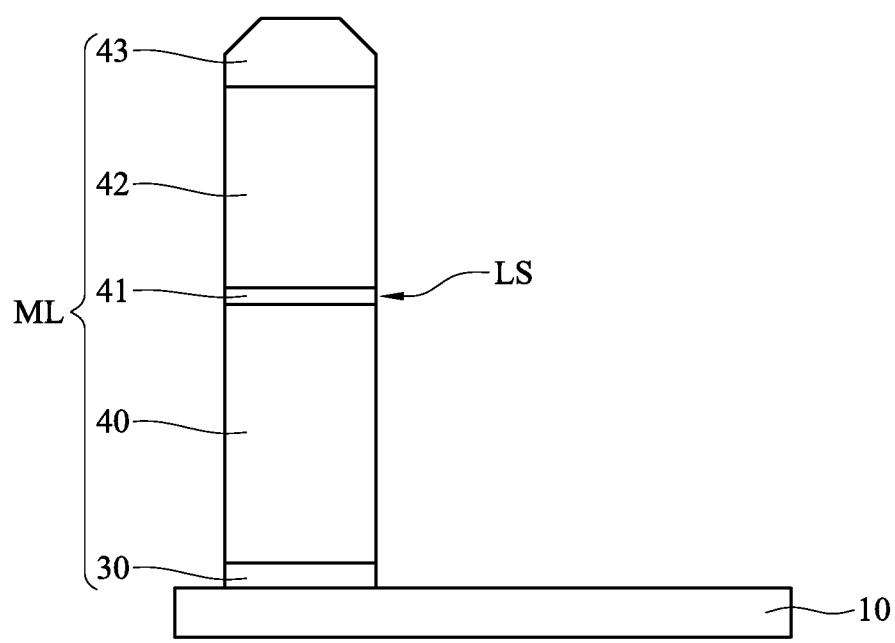

The laminate ML is etched such that each of the first auxiliary layer 30, the device layer 40, the sacrificial layer 41, the protection layer 42 and the hard mask 43 is partially removed. As shown in FIG. 5, parts of the sacrificial layer 41, the protection layer 42 and the hard mask 43 are etched so as to transfer the pattern of the patterned photoresist 720a to the sacrificial layer 41, the protection layer 42 and the hard mask 43. Then, the mask 70a is removed. As shown in FIG. 6, the patterned hard mask 43 is taken as an etching mask for an etching process, and the parts of the first auxiliary layer 30 and the device layer 40 are removed by the etching process. A process for patterning the laminate ML is optional, such that the patterning of the laminate ML is unnecessary for the fabrication of layered structure in some other embodiments.

Take a specific embodiment for example, in order to meet the requirement of high aspect ratio, the mask 70a is taken as the etching mask for a dry etching process (such as reactive ion etching), and parts of the sacrificial layer 41, the protection layer 42 and the hard mask 43 are removed by the dry etching process. After the dry etching process is completed, the mask 70a is removed by organic solution. Then, the patterned hard mask 43 is taken as the etching mask for another dry etching process, and parts of the first auxiliary layer 30 and the device layer 40 are removed by the dry etching process. Thus, the laminate ML is patterned by two dry etching processes.

Figure 7:
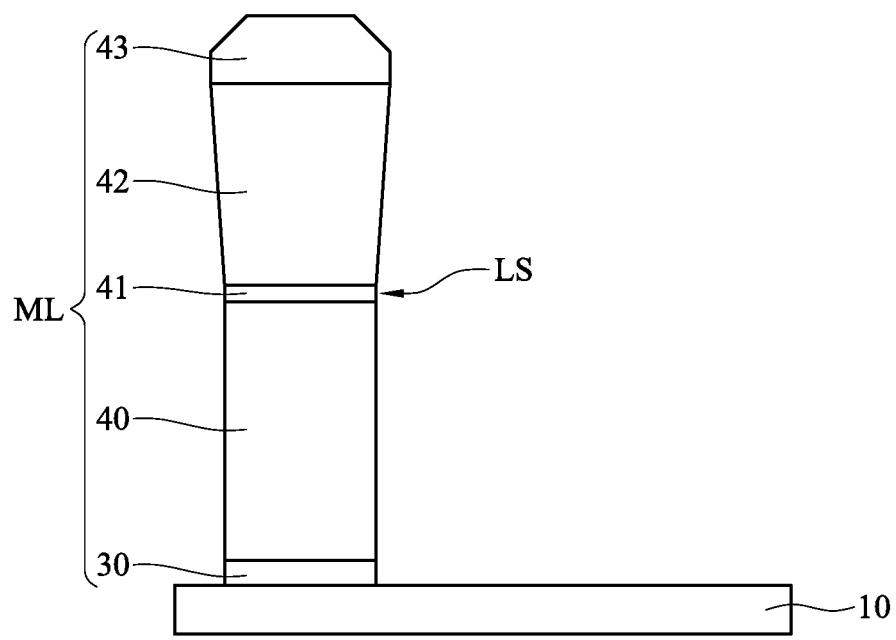
FIG. 7 is a cross-sectional view of a patterned laminate according to one embodiment of the present disclosure.

In FIG. 6, the patterned laminate ML has a lateral surface LS which extends vertically, but the present disclosure is not limited thereto. In another embodiment, the protection layer 42 of the patterned laminate ML is in a shape of trapezoidal cylinder with wide at top and narrow at bottom, such that the lateral surface LS of the patterned laminate ML is partially inclined. The protective layer 42 can be etched to form a wider top portion and a narrower bottom portion by adjusting the process parameters or properly selecting the materials of the protective layer 42 and the hard mask 43. FIG. 7 is a cross-sectional view of a patterned laminate according to one embodiment of the present disclosure, and The advantages of the shape with wide at top and narrow at bottom are further explained hereafter.

FIG. 8 through FIG. 12 are cross-sectional views of removing part of the patterned laminate in FIG. 5 by CMP process. After the laminate ML is formed or further patterned, a dielectric layer 20 is formed to cover the top surface and the lateral surface LS of the patterned laminate ML. In detail, a thin dielectric film 21 is firstly formed to cover the patterned laminate ML, and then the dielectric layer 22 is formed to cover the thin dielectric film 21 and the laminate ML. In this embodiment, the thin dielectric film 21 and the dielectric layer 22 are made of the same material and jointly form the dielectric layer 20 in FIG. 2. The dielectric layer 20 covers the laminate ML; that is, the laminate ML is buried in the dielectric layer 20. The thin dielectric film 21 is able to protect the side wall of the device layer 40, thereby preventing the device layer 40 from being damaged by chemical reaction during the subsequent formation of the dielectric layer 22.

In this embodiment, the thin dielectric film 21 is firstly formed to cover the laminate ML, then the dielectric layer 22 is formed to cover the thin dielectric film 21, and thus the thin dielectric film 21 and the dielectric layer 22 jointly form the dielectric layer 20, but the present disclosure is not limited thereto. In some other embodiments, the dielectric layer 20 covering the laminate ML is formed in a single process; that is, the formation of the thin dielectric film 21 can be omitted.

Then, the hard mask 43, part of the dielectric layer 20 and part of the protection layer 42 are removed by a non-selective CMP process. The dielectric layer 20 and the laminate ML are polished for planarization of the top portion of the laminate ML. After the CMP process is completed, the residual protection layer 42 is removed by etching process so as to expose the sacrificial layer 41.

Figure 8:
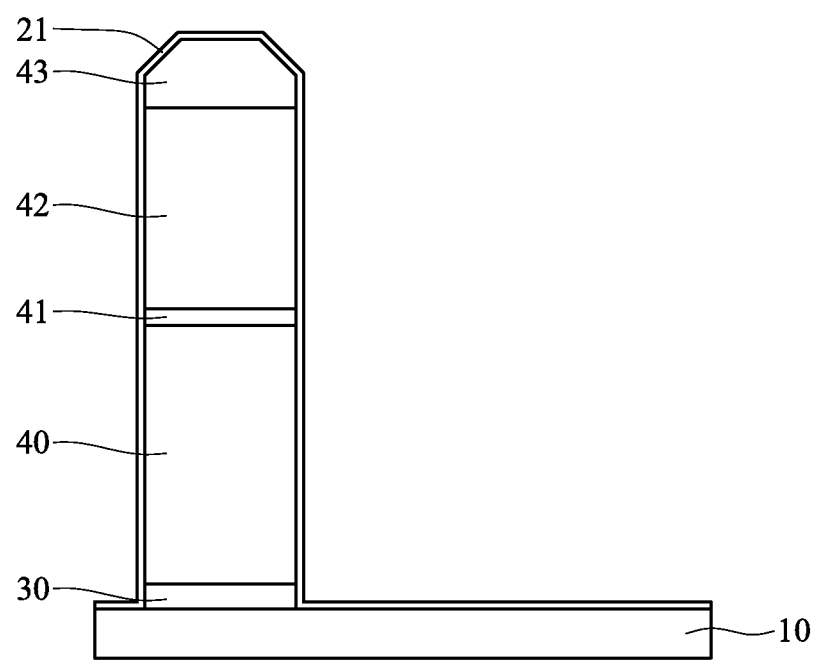
FIG. 8 through FIG. 12 are cross-sectional views of removing part of the patterned laminate in FIG. 5 by CMP process.
Figure 9:
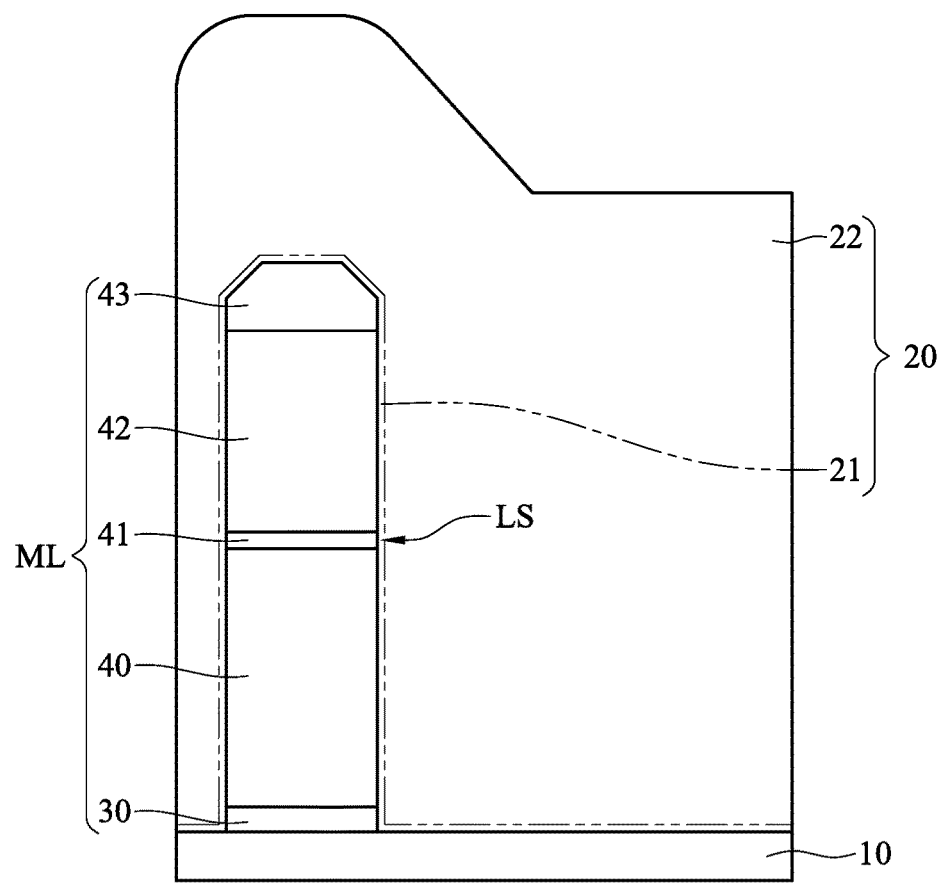
Figure 10:
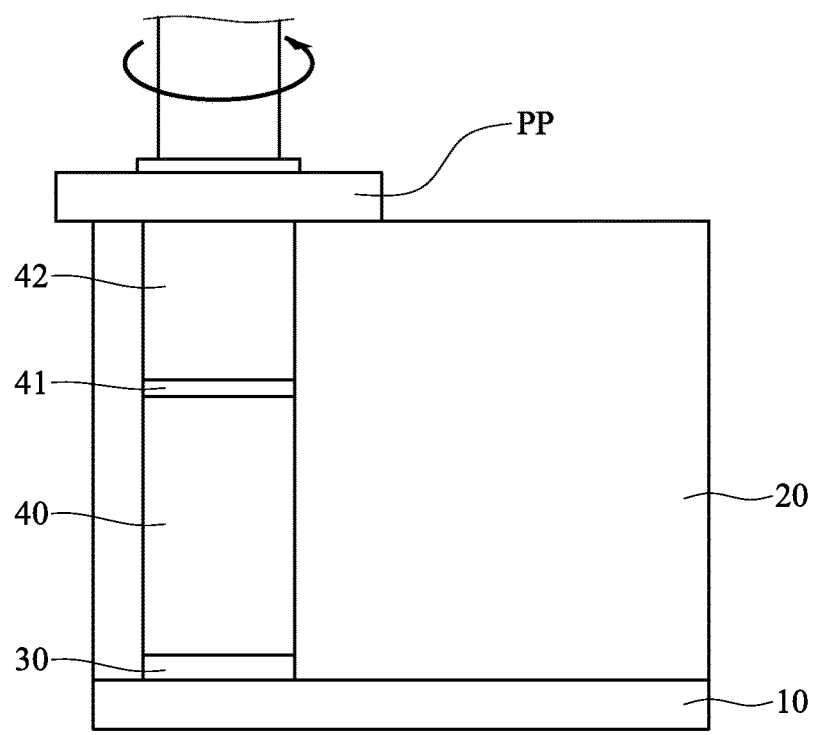
Figure 11:
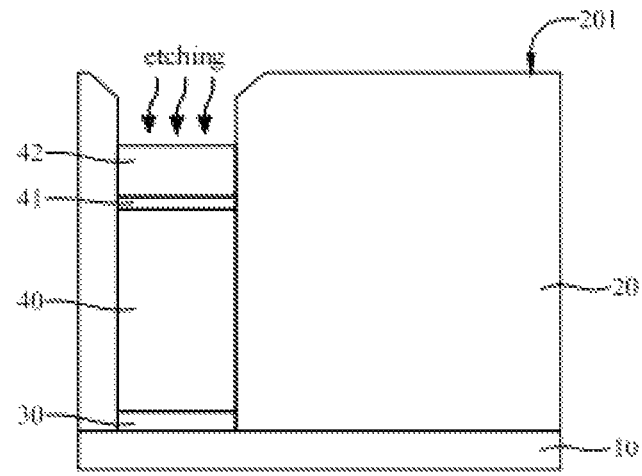
Figure 12:
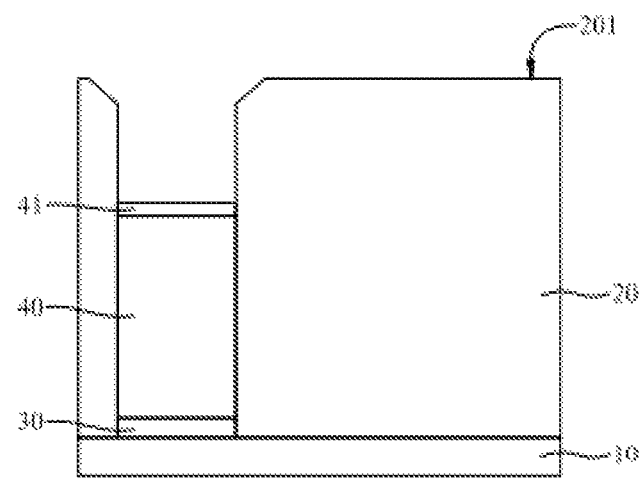

Take a specific embodiment for example, as shown in FIG. 8 and FIG. 9, a silicon oxide layer (thin dielectric film 21) covers the laminate ML, another silicon oxide layer (dielectric layer 22) is deposited on the copper layer (basal layer 10) and covers the laminate ML. As shown in FIG. 10, the silicon oxide layer and the laminate ML are polished by a polishing pad PP; thus, the silicon carbide layer (hard mask 43) is removed, and the thicknesses of both the silicon oxide layer (dielectric layer 20) and the silicon nitride layer (protection layer 42) are reduced in the vertical direction. In this embodiment, the process time (that is, the time for polishing by the polishing pad PP) is controlled so as to remain a certain thickness of the silicon nitride layer after the CMP process is completed. As shown in FIG. 11 and FIG. 12, the residual silicon nitride layer is removed by a wet etching process so as to expose the underlying silicon oxide layer (sacrificial layer 41). In detail, the residual silicon nitride layer is selectively etched by hot phosphoric acid.

In another embodiment, the protection layer 42 of the patterned laminate ML is in the shape of trapezoidal cylinder with wide at top and narrow at bottom. When the protective layer 42 is etched, a larger etching window allows etching solution to easily flow through the etching window, thereby increasing etching yield.

In this embodiment and some other embodiments, the thickness of the protection layer 42 is larger than the thickness of the sacrificial layer 41. The protection layer 42 with larger thickness is favorable for preventing the sacrificial layer 41 from totally removed by the polishing pad PP so as to prevent any damage by the polishing pad PP on the device layer 40. The sacrificial layer 41 with smaller thickness is easier to be removed in the following processes. When the residual protection layer 42 is removed, the sacrificial layer 41 protects the device layer 40. The sacrificial layer 41 and the protection layer 42 can be made of different materials so as to provide a high etching selectivity ratio for etching the protection layer 42 relative to the sacrificial layer 41, and thus the sacrificial layer 41 can have a smaller thickness than the protection layer 42. More specifically, a ratio of the thickness of the protection layer 42 and the thickness of the sacrificial layer 41 is from 10:1 to 100:1, before the protection layer 42 is polished.

Figure 13:
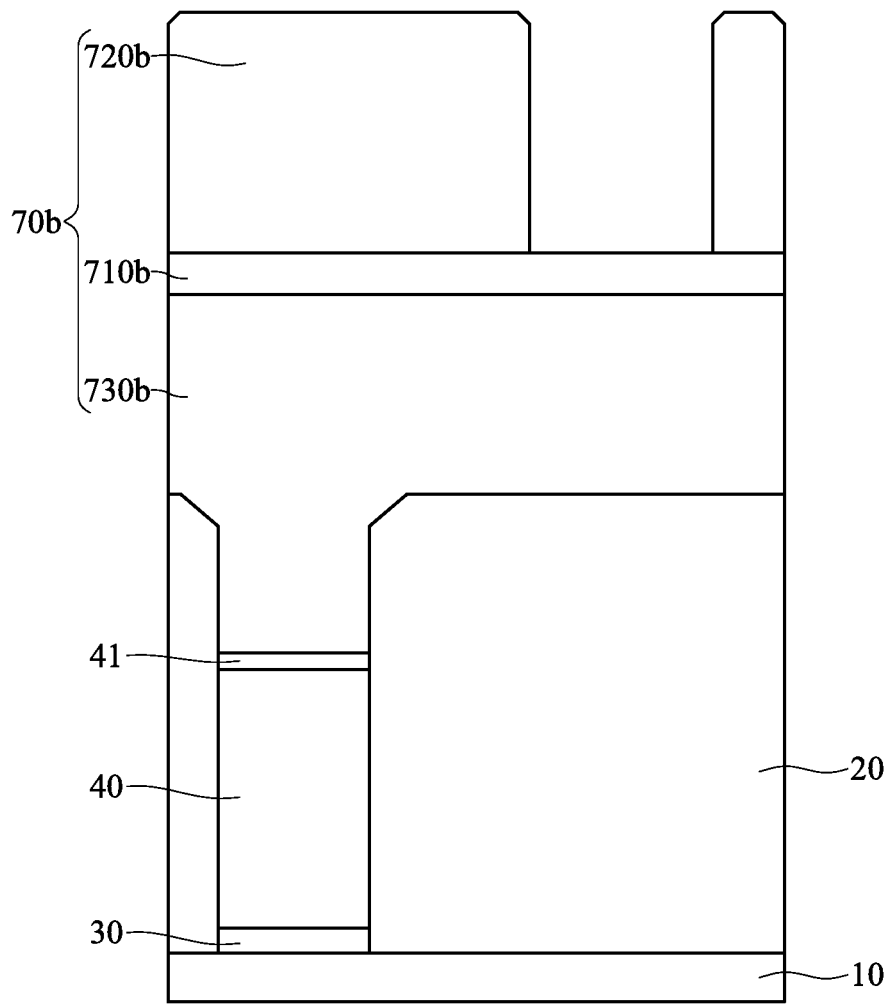
FIG. 13 and FIG. 14 are cross-sectional views of forming a through hole in a dielectric layer in FIG. 12.
Figure 14:
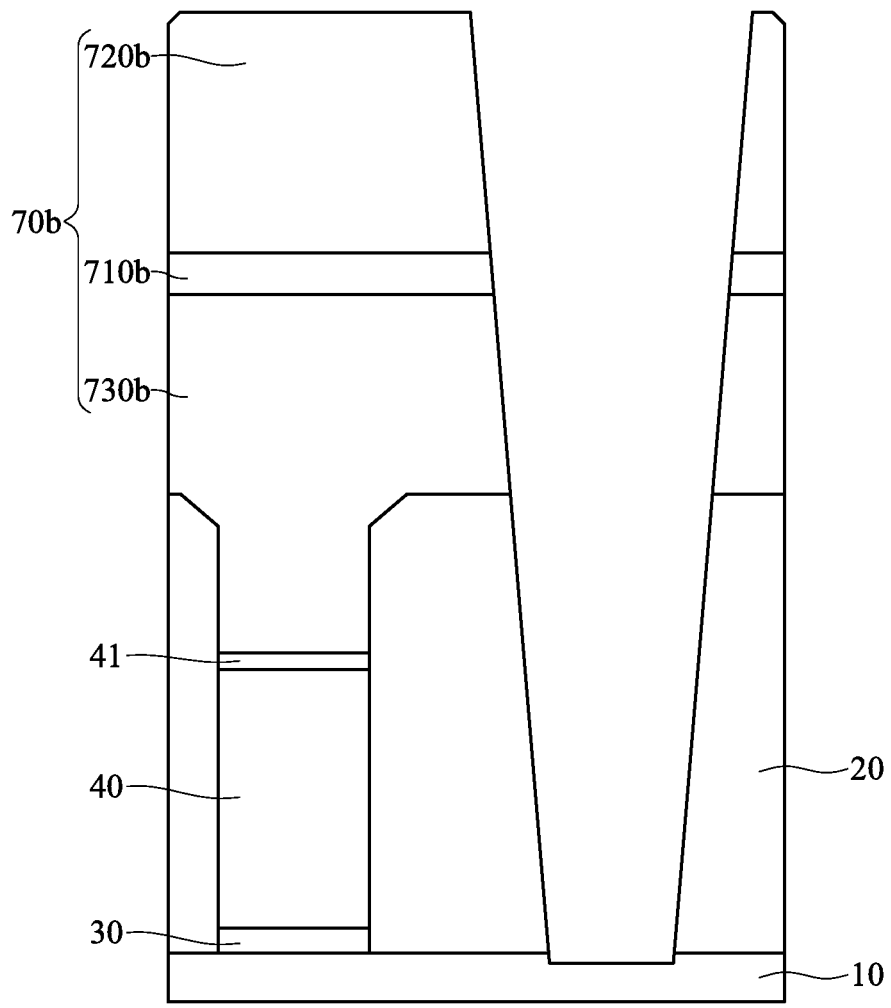

FIG. 13 and FIG. 14 are cross-sectional views of forming a through hole in a dielectric layer in FIG. 12. A mask 70b is formed on the laminate ML, and the mask 70b includes an anti-reflective layer 710b, a patterned photoresist 720b and a dielectric layer 730b. The dielectric layer 730b is disposed to cover the sacrificial layer 41 and the dielectric layer 20. The anti-reflective layer 710b is disposed on the dielectric layer 730b, and the patterned photoresist 720b is disposed on the anti-reflective layer 710b. The patterned photoresist 720b can be obtained by patterning a photoresist film used in optical lithography. Herein, the anti-reflective layer 710b is, for example, a chromium layer configured to minimize light reflection that would double-expose the photoresist, while the anti-reflective layer 710b is optionally deposited according to process requirements.

The dielectric layer 20 and the dielectric layer 730b are etched so as to transfer the pattern of the patterned photoresist 720b to the dielectric layer 20. The dielectric layer 20 is etched so as to form a through hole 210 at the top surface 201 of the dielectric layer 20, and the through hole 210 expose the basal layer 10. The mask 70b is removed after the dielectric layer 20 is etched.

Take a specific embodiment for example, in order to meet the requirement of high aspect ratio, the silicon oxide layer (dielectric layer 20) is patterned by a dry etching process. After the dry etching process is completed, the mask 70b is removed. In one embodiment, the mask 70b is removed by organic solution.

FIG. 15 through FIG. 18 are cross-sectional views of forming a conductive via and a conductive metal layer in the dielectric layer in FIG. 14. The sacrificial layer 41 is etched so as to form an opening 220 in the dielectric layer 20. The opening 220 exposes a top surface 410 of the underlying device layer 40. Then, the second auxiliary layer 50 is formed on the bottom and the side wall of the through hole 210 of the dielectric layer 20, the bottom and the side wall of the opening 220 and the top surface 201 of the dielectric layer 20. The second auxiliary layer 50 contacts the device layer 40 and the basal layer 10. Then, the conductive metal layer 60 is deposited in the through hole 210, the opening 220 and on the top surface 201 of the dielectric layer 20. The conductive metal layer 60 is deposited on the second auxiliary layer 50 and electrically connected with the basal layer 10 and the device layer 40 via the second auxiliary layer 50. Finally, part of the conductive metal layer 60 is removed by another CMP process for planarization of the conductive metal layer 60.

Figure 15:
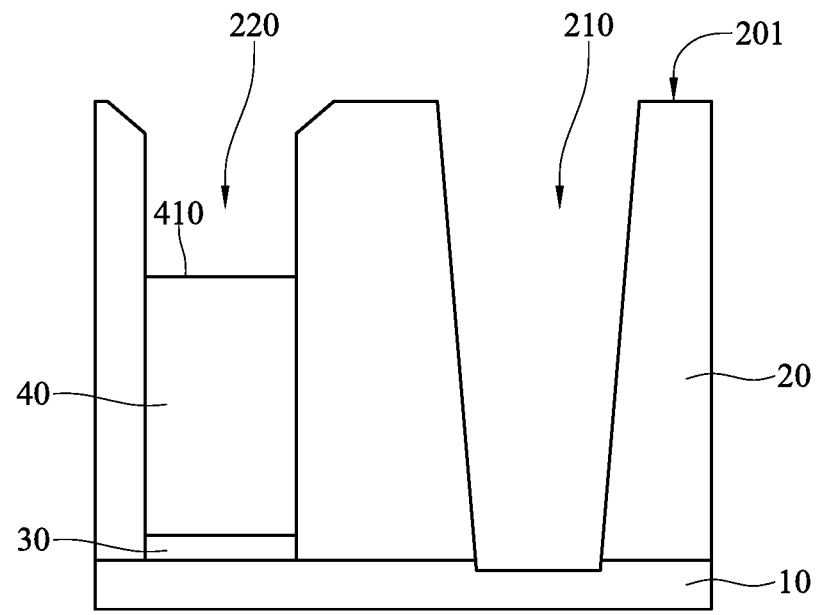
FIG. 15 through FIG. 18 are cross-sectional views of forming a conductive via and a conductive metal layer in the dielectric layer in FIG. 14.
Figure 16:
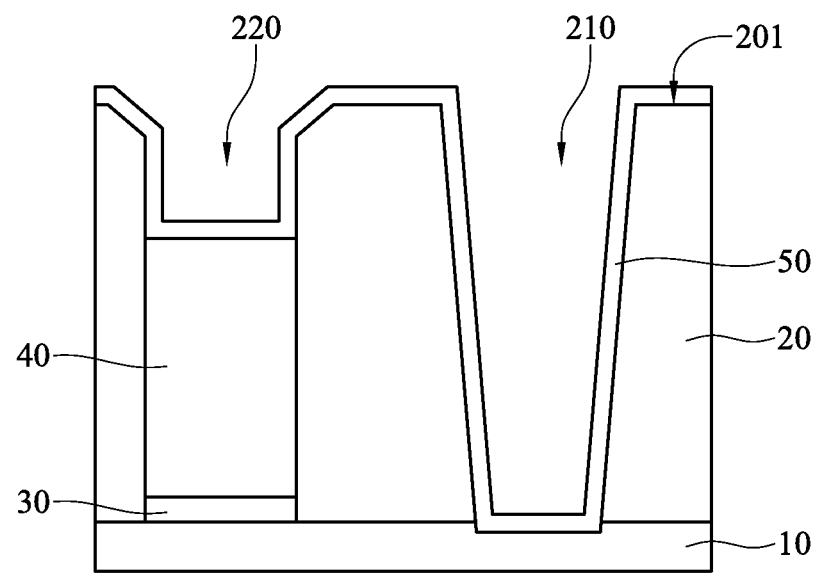
Figure 17:
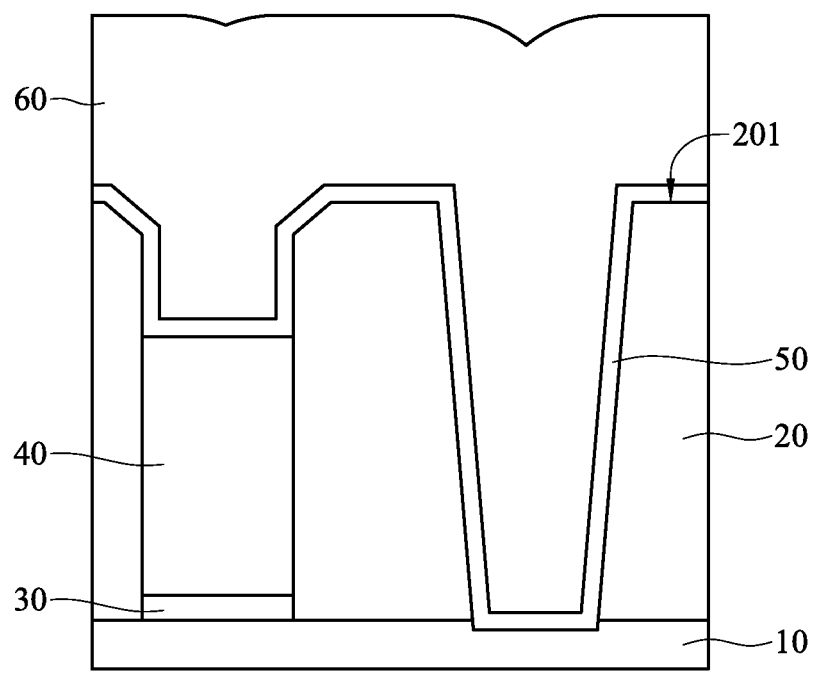
Figure 18:
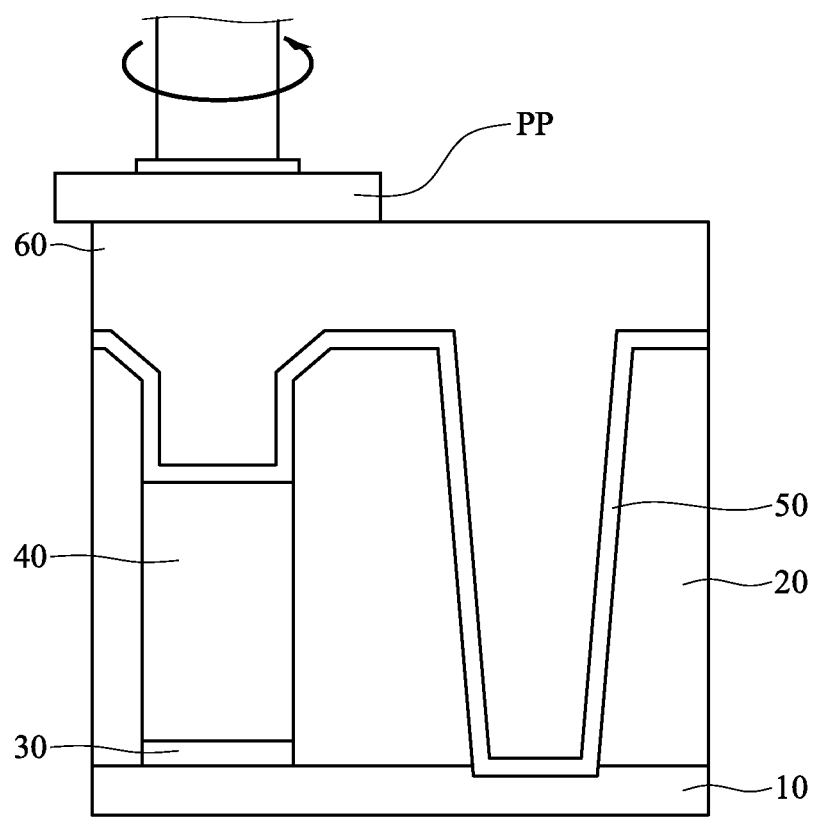

Take a specific embodiment for example, as shown in FIG. 15, the silicon oxide layer (sacrificial layer 41) is removed by a wet etching process so as to expose the underlying silicon diode (device layer 40). More detail, the silicon oxide layer is selectively etched by hydrofluoric acid. As shown in FIG. 16, a titanium nitride layer (second auxiliary layer 50) is deposited on the bottom and the side wall of the through hole 210, the bottom and the side wall of the opening 220 and the top surface 201 of the silicon oxide layer (dielectric layer 20). As shown in FIG. 17, a copper layer (conductive metal layer 60) is deposited on the top surface 201 of the silicon oxide layer and also deposited in the through holes 210 and the opening 220 in a damascene process. In this embodiment, the copper layer is deposited on the titanium nitride layer. The copper layer is electrically connected with the silicon diode (device layer 40) via the titanium nitride layer. As shown in FIG. 18, the copper layer is continuously polished by the polishing pad PP so as to remove part of the copper layer, thereby reducing the thickness of the copper layer in the vertical direction.

In another embodiment, the protection layer 42 of the patterned laminate ML is in the shape of trapezoidal cylinder with wide at top and narrow at bottom. Thus, the opening 220 formed by etching the sacrificial layer 41 and the protection layer 42 is also in the shape of trapezoidal cylinder with wide at top and narrow at bottom. When the conductive metal layer 60 is deposited, the reactive gas flows into the opening 220 more easily so as to be favorable for a better electrical interconnection between the conductive metal layer 60 and the device layer 40.

In this embodiment, the second auxiliary layer 50 is taken as a diffusion barrier layer for preventing the diffusion of copper atoms of the basal layer 10 and dopants of the device layer 40 into the conductive metal layer 60. In some embodiments, the second auxiliary layer 50 can be made of different material so as to be taken as an adhesive layer for increasing the adhesion strength between the conductive metal layer 60 and the basal layer 10.

Furthermore, in this embodiment, the conductive metal layer 60 is formed in the through hole 210, the opening 220 and on the top surface 201 of the dielectric layer 20 by a single metal deposition process. As shown in FIG. 13, the conductive metal layer 60 is formed by a single copper deposition process, and the conductive metal layer 60 is made of single material. More specifically, there is no interface, such as diffusion barrier layer or adhesive layer, between the portion of the conductive metal layer 60 deposited in both the through hole 210 and the opening 220 and another portion of the conductive metal layer 60 deposited above the top surface 201; that is, there is no other metal layer or non-metal layer inside the conductive metal layer 60. Therefore, it is favorable for reducing the steps of process for fabricating the layered structure 1 as well as providing the conductive metal layer 60 with good electrical conductivity. The deposition of the conductive metal layer 60 can be achieved by various techniques such as physical vapor deposition (PVD), chemical vapor deposition (CVD) or atomic layer deposition (ALD).

Figure 3:
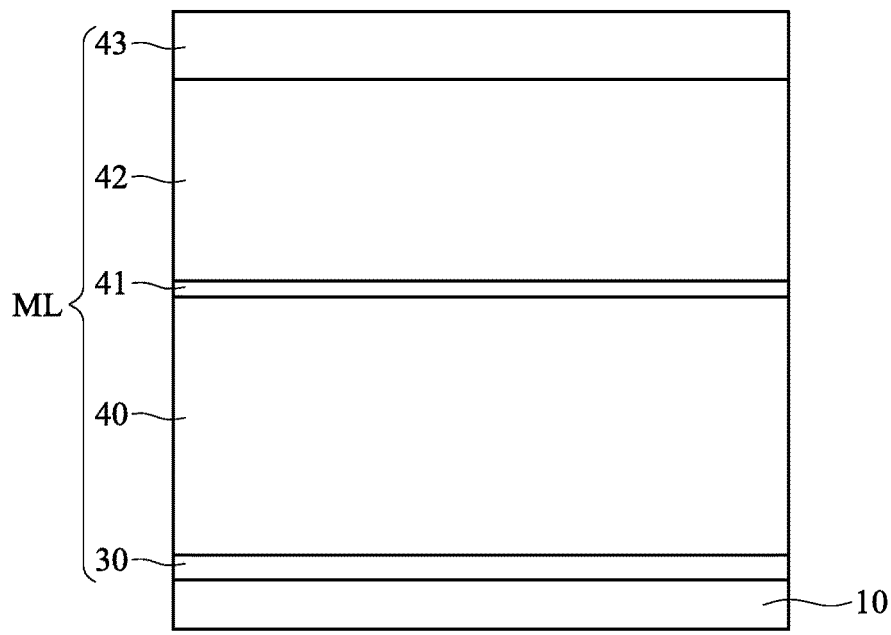
FIG. 3 is a cross-sectional view of a laminate according to one embodiment of the present disclosure.
Figure 4:
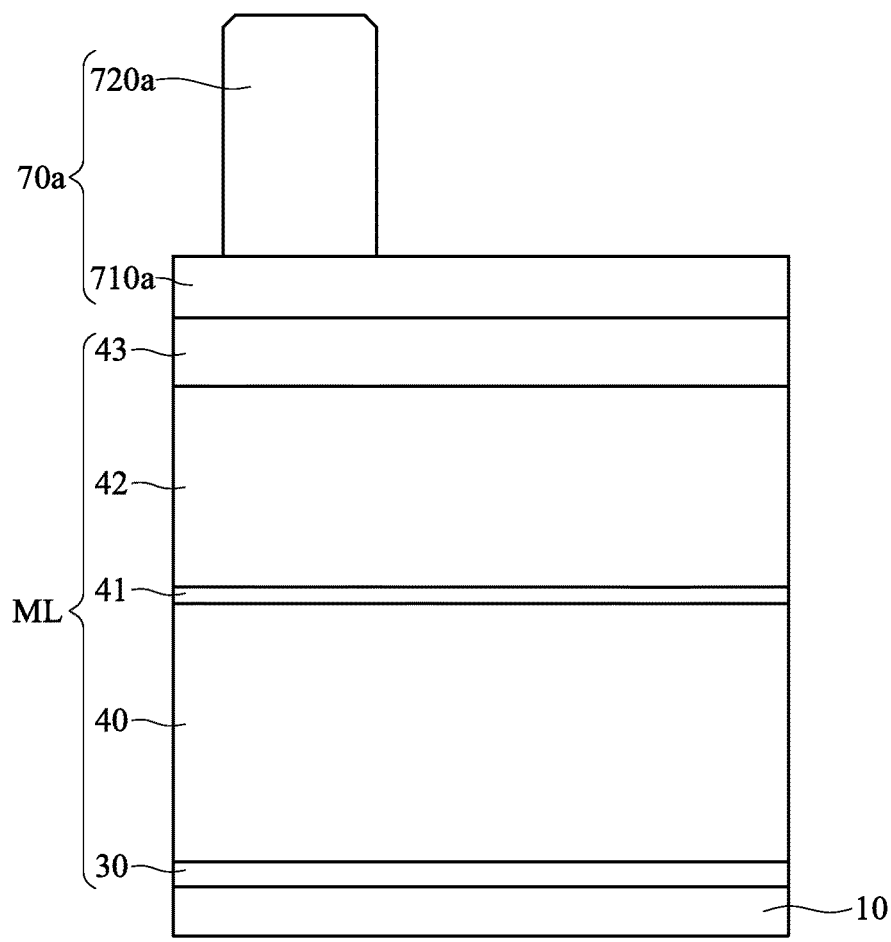
FIG. 4 through FIG. 6 are cross-sectional views of patterning the laminate in FIG. 3.
Figure 19:
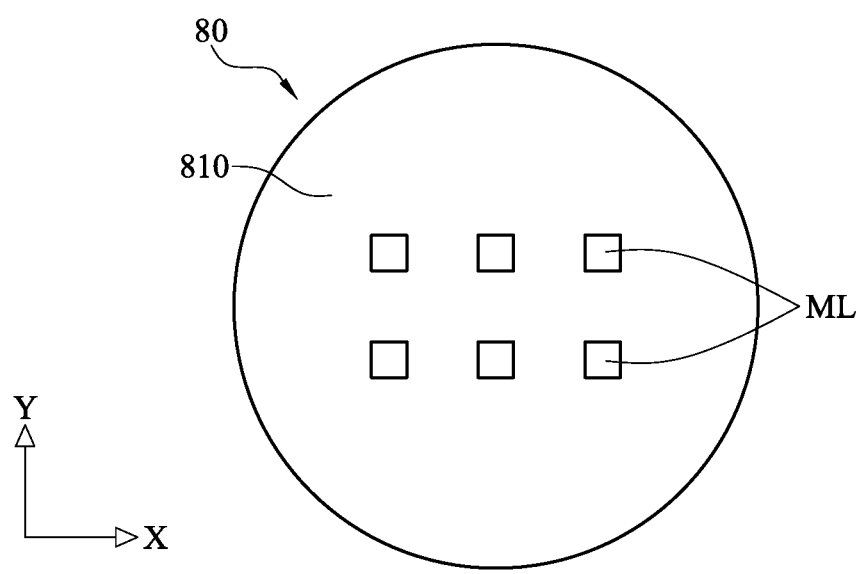
FIG. 19 is a schematic view showing the proportion of cross section of the laminate in a substrate.

FIG. 19 is a schematic view showing the proportion of cross section of the laminate in a substrate. In this embodiment, the laminate ML in FIG. 3 or FIG. 5 is formed on a substrate 80 so as to be taken as a circuit structure in a semiconductor device, and the substrate 80 is, for example, a silicon wafer. As to the laminate ML formed on the substrate 80, a ratio of the cross-sectional area of the laminate ML to the surface area of the substrate 80 is less than or equal to 0.01. In detail, a X-Y plane in FIG. 19 intersects with the laminate ML so as to define a cross section of the laminate ML, and the proportion of this cross section in the top surface 810 of the substrate 80 is less than or equal to 1%. Herein, assume that the method of fabricating the layered structure includes patterning the laminate ML, the cross section of the laminate ML is directed to the cross section of the patterned laminate ML. When the cross section of the Laminate ML is overly small, the polishing pad used in the CMP process is unable to detect that it has rubbed the device layer 40, such that it is unsuitable to finish the CMP process by the detection of stop layer. To solve this problem, a sacrificial layer 41 can be disposed between the device layer 40 and the protection layer 42 so as to allow the CMP process to be finished by setting a predetermined process time. Thereafter, the sacrificial layer 41 and the residual protection layer 42 are removed by etching processes to expose the device layer 40.

According to the present disclosure, a sacrificial layer is disposed between a device layer and a protection layer. After part of the protection layer is removed by polishing, the residual protection layer is removed by etching, and the sacrificial layer protects the device layer from any damage. In the subsequent process, the sacrificial layer is removed by etching so as to expose the device layer. Therefore, in the method of fabricating the layered structure, the process of polishing the layered structure and the process of exposing the device layer are separately performed, such that it is favorable for preventing the device layer from damage in the CMP process, thereby ensuring that the device layer of the layered structure has good electrical properties.

Moreover, after the sacrificial layer 41 is removed, an opening 220 can be formed in the dielectric layer 20 so as to expose the device layer 40. In the subsequent process of forming the conductive metal layer 60, the opening 220 defines the pattern of metal contacts for the interconnection of the device units with the conductive metal layer, such that the conductive metal layer can be self-aligned with the device layer. Therefore, a lithography process for defining the pattern of metal contacts for the interconnection of the device units with the conductive metal layer in the conventional metal deposition can be omitted, and thus it is favorable for the reducing process steps and preventing overlay concern at contact photo on small area patterns.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A method of fabricating layered structure, comprising:
   forming a basal layer;
   forming a laminate on the basal layer, the laminate comprising a device layer, a sacrificial layer and a protection layer stacked in sequence;
   etching the device layer, the sacrificial layer and the protection layer so as to obtain a patterned laminate, wherein the protection layer of the patterned laminate is in a shape of trapezoidal cylinder with that is wider at a top surface than at a bottom surface;
   forming a first dielectric layer covering a lateral surface of the patterned laminate;
   removing part of the first dielectric layer and part of the protection layer by polishing;
   etching the protection layer of the patterned laminate so as to expose the sacrificial layer;
   forming a through hole in the first dielectric layer so as to expose the basal layer; and
   etching the sacrificial layer of the patterned laminate so as to form an opening in the first dielectric layer, and the opening exposing a top surface of the device layer.

2. The method according to claim 1, further comprising:
   depositing a conductive metal layer in the opening, the through hole and on a top surface of the first dielectric layer, wherein the conductive metal layer is electrically connected with the basal layer and the device layer, and the basal layer is made of metal material.

3. The method according to claim 2, further comprising:
   depositing an auxiliary layer on a bottom and a side wall of the opening, a bottom and a side wall of the through hole and the top surface of the first dielectric layer, before depositing the conductive metal layer;

wherein the conductive metal layer is deposited on the auxiliary layer.

4. The method according to claim 1, wherein forming the through hole in the first dielectric layer so as to expose the basal layer comprises:

forming a second dielectric layer covering the sacrificial layer and the first dielectric layer; and patterning the first dielectric layer and the second dielectric layer so as to form the through hole.

5. The method according to claim 1, wherein the protection layer has larger thickness than the sacrificial layer before the protection layer is polished.

6. The method according to claim 5, wherein a ratio of a thickness of the protection layer and a thickness of the sacrificial layer is from 10:1 to 100:1.

7. The method according to claim 6, wherein the thickness of the protection layer is from 30.0 nm to 300.0 nm.

\* \* \* \* \*